United States Patent [19]

Toth et al.

[11] Patent Number: 5,272,131

[45] Date of Patent: Dec. 21, 1993

[54] METHOD FOR FORMING ALIGNED SUPERCONDUCTING BI-SR-CA-CU-O

[75] Inventors: Louis E. Toth, Washington, D.C.; J. Richard Spann, McLean, Va.

[73] Assignee: The United States of America as represented by the Secretary of the Navy, Washington, D.C.

[21] Appl. No.: 497,175

[22] Filed: Mar. 21, 1990

[51] Int. Cl.$^5$ .......................... B05D 3/02; B05D 5/12
[52] U.S. Cl. .......................... 505/1; 505/733; 505/730; 427/62; 427/376.2; 427/376.3; 427/368
[58] Field of Search .......................... 505/1, 733, 730; 427/62, 63, 376.2, 376.3, 368

[56] References Cited

PUBLICATIONS

Akamatsu et al, "Instantaneous preparation of superconducting thick films through melts in the Bi-Ca-Sr-Cu-O system", Jpn. J. Appl. Phys. 27(9) Sep. 1988 L696-698.

Maruyama et al, "Superconducting Bi-Sr-Ca-Cu-O thin films prepared by thermal decomposition of metallic complex salts", Jpn. J. Appl. Phys. 27(11) Nov. 1988 L2084-2087.

Pawar et al, "Preparation of MgO substrates for superconducting films", Mat. Res. Bull. vol. 25(4) (1990) pp. 503-508.

Chaudhuri et al, "Preparation of Superconducting $Bi_4Ca_3Sr_3Cu_4O_x$ (4334) thick film by a rapid quenching method", J. Mat. Sci. Lett. 8 (1989) pp. 520-522.

Shimomura et al, "Preparation of superconductive (Bi,Pb)-Sr-Ca-Cu-O thick films by rapid quenching", Jpn. J. Appl. Phys. 28(4) Apr. 1989 L612-614.

Primary Examiner—Shrive Beck
Assistant Examiner—Roy V. King
Attorney, Agent, or Firm—Thomas E. McDonnell; Barry A. Edelberg; John J. Karasek

[57] ABSTRACT

A process is provided for forming an oriented thick film superconducting coating on a polycrystalline substrate. The coating includes at least two highly oriented compounds of

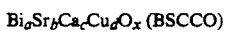

$$Bi_aSr_bCa_cCu_dO_x \text{ (BSCCO)}$$

wherein, in one component, a is 2, b is 2, c is 1, d is 2, and x is 8 and, in another component, a is 2, b is 2, c is 0, d is 1, and x is $\approx 6$. The process comprising applying a powdered mixture prepared from $BiO_3$, $SrCO_3$, $CaCO_3$, and $CuO$ onto a polycrystalline substrate; rapidly heating the resultant coated substrate to a temperature of from about 1000°–1100° C. for a period of from about 30 minutes, thereby melting the powder and forming a thick film coating; rapidly quenching the coated substrate below which phase transition occurs; and annealing the resultant coated substrate by heating in an atmosphere of an oxygen-containing gas to a temperature of from about 850°–870° C. Suitable polycrystalline substrates are MgO and alumina and mullite. The electrical resistance of these films is 0 or above 80K.

18 Claims, 5 Drawing Sheets

METHOD FOR FORMING ALIGNED SUPERCONDUCTING BI-SR-CA-CU-O

BACKGROUND OF THE INVENTION

1. Field of the Invention

The present invention relates in general to a process for forming thick film superconducting coatings on a polycrystalline substrate and, more particularly, to a process for forming a thick film of $Bi_aSr_bCa_cCu_dO_x$ (BSCCO) on a polycrystalline substrate.

2. Description of the Prior Art

It has been determined that the critical temperature of $BiSrCaCu_xO_g$ compound is largely determined by the sintering conditions (annealing temperatures and cooling rate), as well as the Cu content. For example, it was experimentally observed that for $X=1.5$, no sign of superconductivity was observed above 10K. Locquet et al., Solid State Communications, Vol. 66, No. 4, pp. 393–395 (1988). These same tests were conducted by sintering pellets of the preparative compounds, heated to temperatures up to 880° C., followed by slow cooling in air to room temperature to yield randomly oriented polycrystalline bodies having 0 resistance at 72K.

It is known that superconductivity can be obtained with Bi—Sr—Ca—Cu—O systems by first calcining in air the mixture of starting oxides and carbonates at temperatures between 800°–900° C. and then annealing at temperatures up to 870° C. It was found that with higher annealing temperatures, the metallic character of the resistivity is often lost, and superconductivity is deleteriously affected S. A. Shaheen, Solid State Communication, Vol. 66, No. 9, pp. 947–951 (1988).

The superconducting transport properties of high temperature superconducting are highly anisotropic, and the critical currents in oriented films are much higher than those in unaligned materials. It is not known whether highly oriented thick films of BSCCO exhibiting superconductivity at elevated temperatures can be formed on a polycrystalline substrate.

It was believed that a superconductor coating should be applied to single crystal substrates for the purpose of matching the lattice structure of the coating with that of the substrate in order to obtain an aligned coating, i.e., a coating with a high current carrying capacity. Conversely, it was believed that the use of a polycrystalline substrate would inhibit the alignment of a superconductor coating thereon; consequently, the use of polycrystalline substrates was considered to be undesirable. For example, a thick BSSCO coating has been applied to a monocrystalline MgO substrate, but no attempt was made to apply it to a polycrystalline MgO substrate. Y. Akamatsu et al., Jpn. J. Appp. Phys. Letters, 27 L1696–L1698 (1988). In the process described by Akamatsu, a powdered mixture of $Bi_2O_3$, $CaCO_3$, $SrCO_3$, and CuO are ground together and melted at 1200° C. for 30 minutes without calcination or sintering on an MgO single crystal substrate in air. The melt is then cooled in a furnace at about 40° C./minute to a selected temperature between 700°–900° C. for periods of time from 0 to 2 hours, and then air cooled to room temperature. This procedure often results in the formation of undesired impurities, i.e., $CaCuO_x$ or $(CaSr)CuO_x$ or secondary phases.

It is desirable to have a process for forming thick film superconducting coatings of BSCCO on polycrystalline substrates. This is especially true because coatings made via melt/crystallization techniques are useful in the preparation of devices with complex shapes such as magnetic shields and microchip transmission lines. It is also desirable to provide a process of forming such a superconducting coating without significant amounts of undesirable impurities.

SUMMARY OF THE INVENTION

A process is provided for forming an oriented thick film superconducting coating on a polycrystalline substrate, the coating comprising at least two highly oriented components of

$Bi_aSr_bCa_cCu_dO_x$ (BSCCO)

wherein, in one component, a is 2, b is 2, c is 1, d is 2, and x is 8 and, in another component, a is 2, b is 2, c is 0, d is 1, and x is $\approx 6$, said process comprising applying a powdered mixture prepared from $Bi_2O_3$, $SrCO_3$, $CaCO_3$, and CuO onto a polycrystalline substrate; rapidly heating the resultant coated substrate to a temperature of from about 1000°–1100° C. for a period of from about 5–30 minutes, thereby melting the powder and forming a thick film coating; rapidly quenching the coated substrate to below 500° C., which is below the temperature at which phase transition occurs; and annealing the resultant coated substrate by heating in an atmosphere of an oxygen-containing gas to a temperature of from about 850°–870° C. Suitable polycrystalline substrates are MgO and alumina and mullite. Optionally, the resultant annealed coated substrate can be lightly polished to remove at least some of the resultant excess $CaCuO_3$ on the surface of the thick film coating. Additionally and optionally, the polished coated substrate can be annealed by heating to a temperature of from about 840°–870° C.

DETAILED DESCRIPTION OF THE INVENTION

It has been unexpectedly found that a highly oriented thick film of superconducting material can be formed by using melt/crystallization techniques on polycrystalline substrates. Coated polycrystalline substrates coated according to the present invention have been unexpectedly found to have a resistance of 0 at a temperature of 80K or higher and a current density J° greater than 1700 $A/cm^2$ at 64K and greater than 6000 $A/cm^2$ at 4.2K.

According to the present invention, a powder mixture for use in coating the substrate is prepared by mixing $BiO_3$, $SrCO_3$, $CaCO_3$, and CuO. In a preferred embodiment, the stoichiometric ratios of these components can be 4:3:3:4, 4:3:3:6, 2:2:2:3, and 2:2:3:4, respectively. However, other stoichiometric ratios of these components can be used.

Preferably, these components in powdered form are mixed and milled in a solvent, the solvent evaporated, and the resultant mixture calcined in air. In a preferred embodiment, the powdered mixture is calcined at a temperature of from about 840°–860° C. to remove carbonate and any hydroxides and water. More preferably, calcining is carried out by rapidly heating the powder to about 857° C. for about 3 hours in air or in a vacuum and then cooling slowly over a period of about 16 hours in oxygen to 250° C. after a holding period of 4 hours between 875°–825° C. Although there is no limitation on the weight of the resultant calcined powder to be used per unit area of the substrate, it is preferred to use a sufficient amount of the powdered coating material to cover the surface so that upon melting, a continuous coating is obtained. In a preferred embodiment, sufficient powdered coating is used to produce a coating having a resultant thickness ranging from about 75–250 μm.

Although any type of polycrystalline substrate can be used, it is preferred to use as the polycrystalline substrate MgO, alumina, or mullite. Other preferred polycrystalline substrates are $SrTiO_3$, $ZrO_2$, $ZrTiO_4$, $BaTiO_3$, $Y_2O_3$, or mixtures thereof.

Following application of the powdered coating, the resultant coated substrate is then rapidly heated to a temperature ranging from about 1000°–1100° C. for a period of from about 5–30 minutes to melt the powder and form a thick continuous coating.

In a preferred embodiment, the powder mixture applied to the substrate is no larger than about 150 μm. More preferably, the powder mixture has a size range of from about 1–10 μm.

In a preferred embodiment, after the powder mixture has been applied to the polycrystalline substrate, it is heated to a temperature of from about 1050°–1100° C. for a period of up to 20 minutes to effect complete melting of the coating.

The molten coating is then preferably rapidly quenched to a temperature below which phase transition occurs. In a preferred embodiment of the present invention, the rapid quenching is conducted in an oxygen-containing gas at a temperature decrease of at least 50° C. per minute, more preferably, from about 100° C. per minute to about 125° C. per minute to below 500° C. and preferably to room temperature. In the quenching step, the oxygen-containing gas can be air, pure oxygen, or, preferably, a gas containing 10–1 vol. % of oxygen. In another embodiment, the melting and rapid quenching can be effected in a vacuum.

After quenching to room temperature, the coated substrate can then be annealed by heating in an atmosphere of an oxygen-containing gas to a temperature of from about 850°–870° C., more preferably from about 855°–860° C. for a period of preferably from 1–2 hours. Other heating periods can be used, depending on the annealing temperature. In a preferred embodiment, the surface layer of the film is heated treated in flowing $O_2$ by heating it rapidly over a period of ≈5 hours from room temperature to 860° C., cooling to 825° C. in 4 hours, and then cooling to 700° C. in 10–30 hours. The heated sample is preferably held at 700° C. for 10 hours and then cooled to room temperature in 4–50 hours.

Optionally, the resultant annealed coated substrate is lightly polished with dry No. 600 grit SiC paper, cleaned ultrasonically in dry alcohol or acetone, and dried to remove most of any $CaCuO_3$ impurities formed on the surface of the thick film coating. The polished coated substrate can then optionally be reannealed to a temperature of from about 840°–870° C. for a period of from about 1–10 hours, more preferably 1–2 hours. The reannealing was found to contribute to the formation of additional 2212 BSCCO phase in the coating. It is believed that insignificant amounts of impurities are present in the final product produced according to the present invention.

When sufficient powder is applied to the polycrystalline surface, the thickness of the resultant melted thick film coating ranges from about 75–250 μm. Advantageous results can also be obtained by using in the powdered mixture $Bi_2Sr_2Ca_2Cu_3O_{10}$.

BRIEF DESCRIPTION OF THE DRAWINGS

Various other objects, features, and attendant advantages of the present invention will be more fully appreciated as the same becomes better understood when considered in conjunction with the accompanying drawings in which like reference characters designate the same or similar parts throughout the several views and wherein:

FIG. 1(a) shows the x-ray diffraction pattern of the film after one anneal with $Ca_2CuO_3$ present. The indices of the 2212 peaks are above them; x indicates $Ca_2CuO_3$ or $(Ca,Sr)_2CuO_3$. FIG. 1(b) shows the same x-ray diffraction pattern of the film after polishing and reannealing. The alignment of both the high (2212) and low (2201) $T_c$ material is also shown.

FIG. 1(a) shows the film as initially annealed with BSCCO platelets (the bar represents 77 μm). FIG. 1(b) shows the $Ca_2CuO_3$ needles near the film surface (the bar represents 77 μm).

Figure 1A:
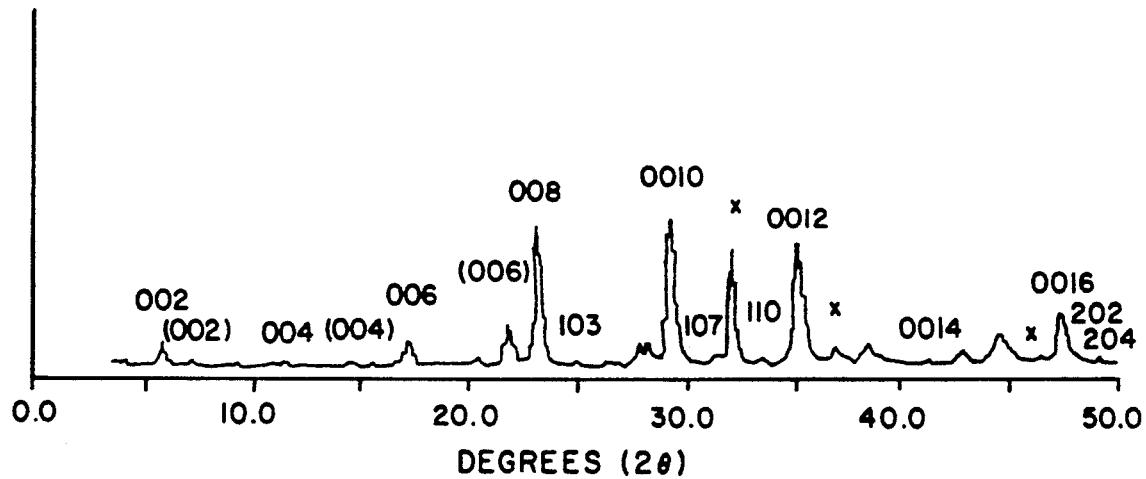
FIGS. 1(a) and 1(b) shows several X-ray diffraction patterns of a thick 2201 BSCCO film on a polycrystalline MgO substrate produced by the process of the present invention. The relative intensity scale in FIGS. 1(a) and 1(b), is logarithmic.

Without further elaboration, it is believed that one skilled in the art can, using the preceding description, utilize the present invention to its fullest extent. The following preferred specific embodiments are, therefore, to be construed as merely illustrative and not limitative of the remainder of the disclosure in any way whatsoever.

In the foregoing and in the following examples, all temperatures are set forth in Kelvin or degrees Celsius; and, unless otherwise indicated, all parts and percentages are by atomic percent.

The entire disclosures of all applications, patents and publications, cited above and below, are hereby incorporated by reference.

EXAMPLE 1

Preparation of Coated Samples

Thick films of BSCCO were prepared from stoichiometric ratios (4334, 4336, 2223, and 2234) of high purity $Bi_2O_3$, $SrCO_3$, $CaCO_3$, and CuO. The powders were mixed and milled in acetone with $ZrO_2$ balls for 24 hours and then flash dried. They were then calcined in air at ≈850° C. for 1–4 hours to form a BSCCO precursor. The calcined BSCCO precursor was ball-milled with $ZrO_2$ balls for $\approx 1$ hour in acetone and dried. The milled powder was then placed as a thin layer on top of the substrate. Polycrystalline MgO (Norton Company, Worcester, Mass.); cut from randomly oriented, hot-pressed discs with grain size of about 50 μm), single crystal MgO (001), and polycrystalline $Al_2O_3$ were used as substrates. The "coated" substrates were heated to $\approx 1050°$ C. After a brief hold ($\leq 20$ minutes) to ensure complete melting, the samples were typically quenched at a rate of temperature drop of at least 100° C./min to room temperature in air. The coated substrates were then annealed in air or $O_2$ for at least 15 hours at 860° C. and then furnace cooled to room temperature at a controlled rate in flowing $O_2$. Several samples were subjected to a second anneal. In one variation, a melted, quenched, and annealed sample was lightly polished and then reannealed at 860° C. and slowly cooled. In a second variation, a melted, quenched, and annealed sample was heated to 850° C. and then quenched again and sectioned. In a third variation, after melting, several samples were allowed to cool very slowly to the annealing temperature instead of quenching to room temperature, followed by reheating to 860° C. and then annealing.

EXAMPLE 2

Testing of Control Samples

Samples were examined visually and then with: X-ray diffraction; optical microscopy; scanning electron microscopy with energy dispersive analysis (SEM with EDS); resistance versus temperature measurements; and critical current measurements. The resistance measurements were made using a four-point probe technique with gallium-indium electrodes. Critical current measurements were made using a four-point probe technique. The sample film was ground into the shape of a letter H. The vertical parts of the letter served as the current electrodes and the voltage was measured at two points along the horizontal bar 3.4 mm apart. The bar was 1.3 mm wide and 0.1 mm thick. The sample was immersed in liquid He (4.2K) or pumped liquid nitrogen (74 and 64K) for the test. The E-Field criterion was used for the determination of $J_c$ and 10 μV/cm. No external magnetic field was applied.

Visual observation revealed that on a macrographic scale, the process of the present inventions yielded dense, uniform, reflective coatings, about 150 μm thick, on both polycrystalline and single crystal MgO. The edges and back of the MgO substrates were partially coated with BSCCO, indicating that BSCCO wets MgO. In the case of $Al_2O_3$, the wetting was not as complete and the coating was highly non-uniform.

Figure 1B:
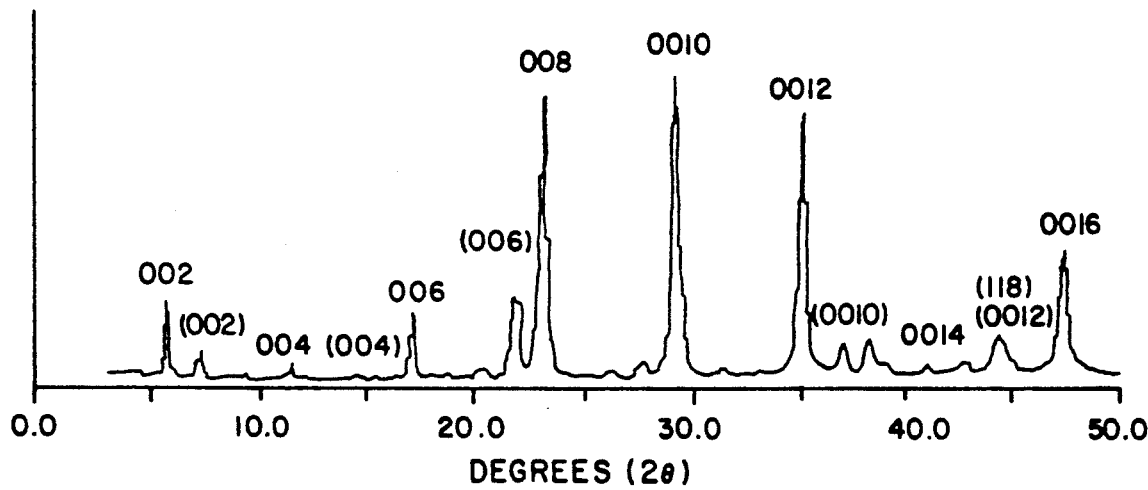

X-ray diffraction analysis of the fired thick films on MgO substrates showed that all of the films were crystalline and highly oriented with either $Bi_2Sr_2CaCu_2O_x$ (2212) or $Bi_2Sr_2Cu_1O_x$ (2201) as the predominant phase. Heat treatment affected the relative proportions of 2201 and 2212, but unlike melted and quenched bulk materials, many thin film materials, plasma-sprayed thick films, and sintered bulk or thick film samples, amorphous or randomly oriented films were not produced. Even the as-quenched films were crystalline and highly oriented. The 2212 BSCCO was analyzed on the basis of a pseudotetragonal unit cell yielding unit cell parameters of approximately a=0.382 nm and c=3.05 nm. The 2201 BSCCO was also analyzed as a pseudotetragonal material with unit cell parameters of approximately a=0.383 nm and c=2.42 nm. A typical diffraction pattern is shown in FIG. 1. The orientation of the crystallites is indicated by the greatly enhanced intensities of the (001) lines and the almost complete absence of any non-(001) lines. All the precursor compositions gave similar results, although the 4336 compositions produced films with the highest amounts of 2212 phase and the largest $J_c$s.

A combination of X-ray diffraction analysis, SEM/EDS and optical microscopy identified $Ca_2CuO_3$ (or $(Ca,Sr)_2CuO_3$) as a minor phase. For the 4336 compositions, the amount of $Ca_2CuO_3$ was significant; it was less so for the 4334 compositions. The optical microscopy and SEM analysis indicated that the cuprate phase existed predominantly on top of the BSCCO layers after the quenched films were annealed. This indicated that the as-annealed films were not homogenous. Gentle polishing of the surface layer of a 4336 film removed the $Ca_2CuO_3$ needles. They did not reappear after a subsequent anneal at 860° C.

The presence of the cuprate needles prompted further investigation of the homogeneity of the samples. Of special interest was the relative proportions of the 2212 and 2201 phases in the interior of the films. The quenched and annealed film which was polished to remove the cuprate needles was X-rayed before it was polished, after it was polished, and after it was reannealed. Before polishing, the surface was $\approx 90\%$ 2212 phase and $\approx 10\%$ 2201 phase. After polishing, the sample was $\approx 50\%$ 2212 and $\approx 50\%$ 2201. This indicated that the relative proportions of 2212 phase and 2201 phase varied through the thickness of the films after the annealing treatment. Reannealing the sample at 860° C. restored the surface composition to c90% 2212 phase and $\approx 10\%$ 2201 phase. Visual observation indicated that some melting occurred during the $\approx 10\%$ 2201 phase. Visual reanneal at 860° C. since the cracks from polishing marks had healed. By comparison, X-ray diffraction of the as-quenched films indicated they were $\approx 70\%$ 2212 phase and $\approx 30\%$ 2201 phase near the surface. This shows that the initial annealing treatment increased the relative proportion of 2212 near the surface of the films, although it did not produce homogenous films.

EXAMPLE 3

Reannealed Samples

To further understand the effects of heat treatment, another quenched and annealed 4336 film was reannealed and then sectioned and films cooled slowly from the melting temperature to the annealing range were examined. The quenched and annealed 4336 film was not polished to remove the cuprate needles before it was reannealed by heating it up to 850° C. and then quenching. This treatment did not affect the surface composition, it remained at >90% 2212 phase and <10% 2201 phase. However, it did appear to affect the homogeneity of the interior of the film. After grinding about 50 μm from the surface, the sample remained >90% 2212 phase and <10% 2201 phase, although the alignment was not quite as good as that on the outer surface. Grinding another 50 μm from the sample did not change the X-ray pattern significantly. It was still >90% 2212 phase and <10% 2201 phase with less alignment than the original surface, indicating that the second anneal had helped to homogenize the film and increase the 2212 content throughout. When the 4336 precursor composition was melted and then allowed to cool very slowly to the annealing temperature, rather than being quenched to room temperature before annealing at 860° C., very little of the 2212 BSCCO phase was observed. Instead, the predominant phase was the Ca-free 2201 phase (as indicated by the X-ray peaks at $2\theta=7.5°$ and 21.9°). (Ca,Sr)-Cu-O oxides were also present. Annealing did not significantly reduce the amount of the 2201 phase, nor did it increase the amount of the 2212 phase.

The results of these tests show that the phase equilibria may be complex and that physical separation of the Ca-rich and Ca-poor phases occurs during slow cooling from the melt. Quenching minimizes the phase separation in the film and keeps the excess Ca and Cu distributed relatively uniformly within the film. When a quenched sample is annealed, the 2212 phase can then be formed by the reaction of the 2201 phase with calcium and oxygen. As previously noted the as-quenched films were >70% 2212 and <30% 2201 by X-ray analysis of the surface, while the quenched and annealed samples were >90% 2212 and <10% 2201 by X-ray analysis of the surface. The reaction of 2201 to form 2212 is apparently controlled by the distance between the 2201 phase and the excess Ca and Cu rather than diffusion of oxygen in from the surface of the film. A second anneal at 850° C. produced a sample that was >90% 2212 throughout its thickness, and, while the amount of 2212 in the slow-cooled sample was not increased by annealing, it was increased by remelting and quenching. Had oxygen diffusion been the rate-controlling step, the reanneal of the slowly cooked samples would have increased the amount of 2212.

The homogeneity of the sample (including its oxygen content) was found to be important. The film which had been polished to remove the cuprate needles and then reannealed had a higher R=0 temperature (80K) and a larger $J_c$ (>1700 A/cm² at 64K and >6000 A/cm² at 4.2K) than the films which were only annealed once (R=0 at 72-75K and $J_c$=50-100 A/cm² at 64K). These results, in conjunction with the sectioning results of the sample reannealed at 850° C., indicate that reannealing increases the homogeneity of the film and thus effectively increases the cross-sectional area of the 2212 phase available to carry current. These tests show that according to the present invention, a thick film on polycrystalline MgO which is highly oriented and at least 90% 2212 will be superconducting at temperatures below 80K with the ability to carry currents >$10^3$ A/cm² at 64K.

Figure 2:
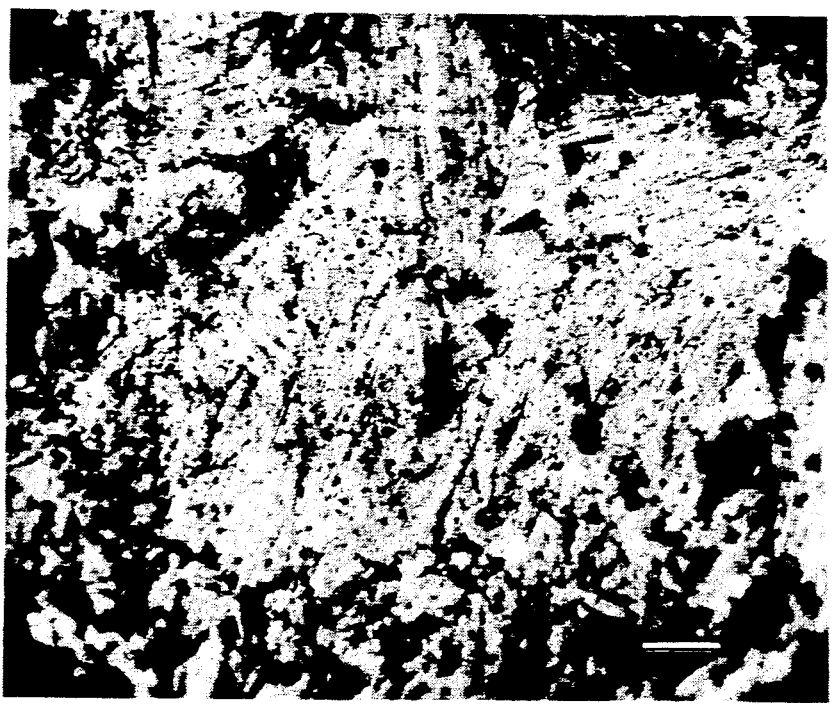
FIG. 2 is a photomicrograph of the surface of a coating produced according to the present invention showing a typical area of a well-aligned film after mechanical removal of the $Ca_2CuO_3$ needles and reannealing (the bar represents 77 μm).
Figure 3A:
FIGS. 3(a) and 3(b) show several optical micrographs of a 4336 composition film on polycrystalline MgO.
Figure 3B:
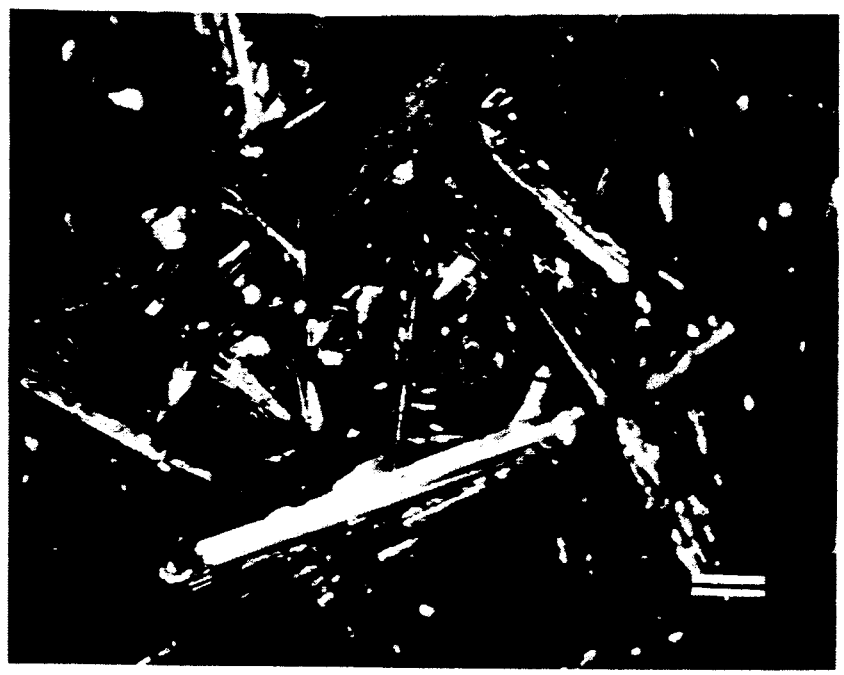

FIGS. 3a and 3b show the optical micrographs of the BSCCO and Ca₂CuO₃ regions. The large grain size and preferred orientation of the BSCCO platelets are evident. The Ca₂CuO₃ phase formed as needles or as fan-shaped clusters of needles. These were oriented parallel to the surface of the substrates. FIGS. 2 and 3 also show that the grain size of the 2212 BSCCO is $\approx$200 μm, which is significantly greater than the grain size of the randomly oriented polycrystalline substrate. These tests show that the orientation is a result of the crystallization and that crystallization occurs from the surface, since the surface is more highly oriented than the interior. Consequently, finer grained polycrystalline MgO substrates can be used to support oriented BSCCO films because the compatibility of the MgO substrates is related more to the wetting of the substrate by BSCCO than to crystal structure considerations. The melting of the BSCCO is also important, since it allows orientation of the crystallites during the crystallization process, resulting in much denser films than would be possible if randomly oriented crystallites had formed during standard solid state sintering.

Figure 4:
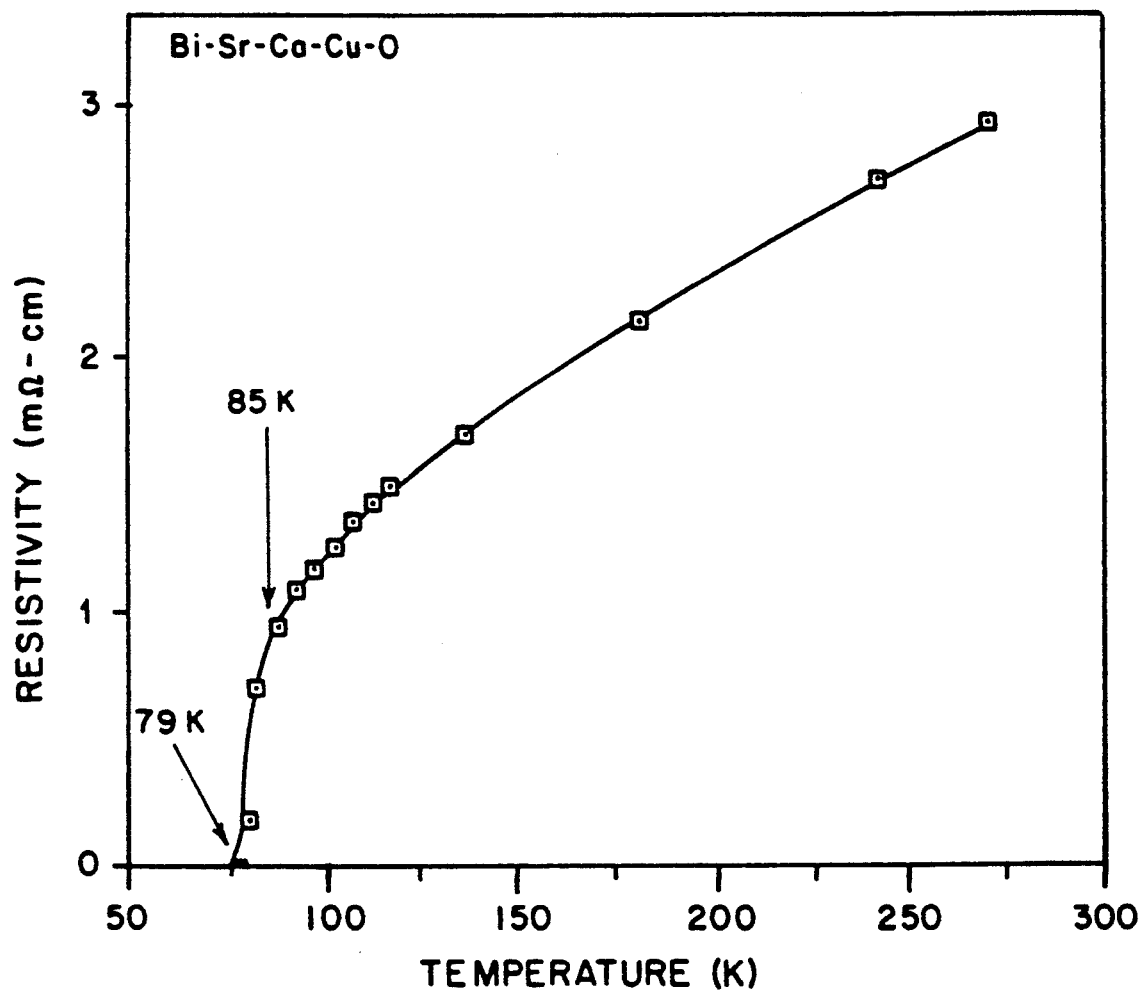
FIG. 4 is a graph of resistivity versus temperature for a well-aligned BSCCO film produced according to the present invention. The graph illustrates that the resistivity values are relatively low as compared to typical unoriented films.
Figure 5:
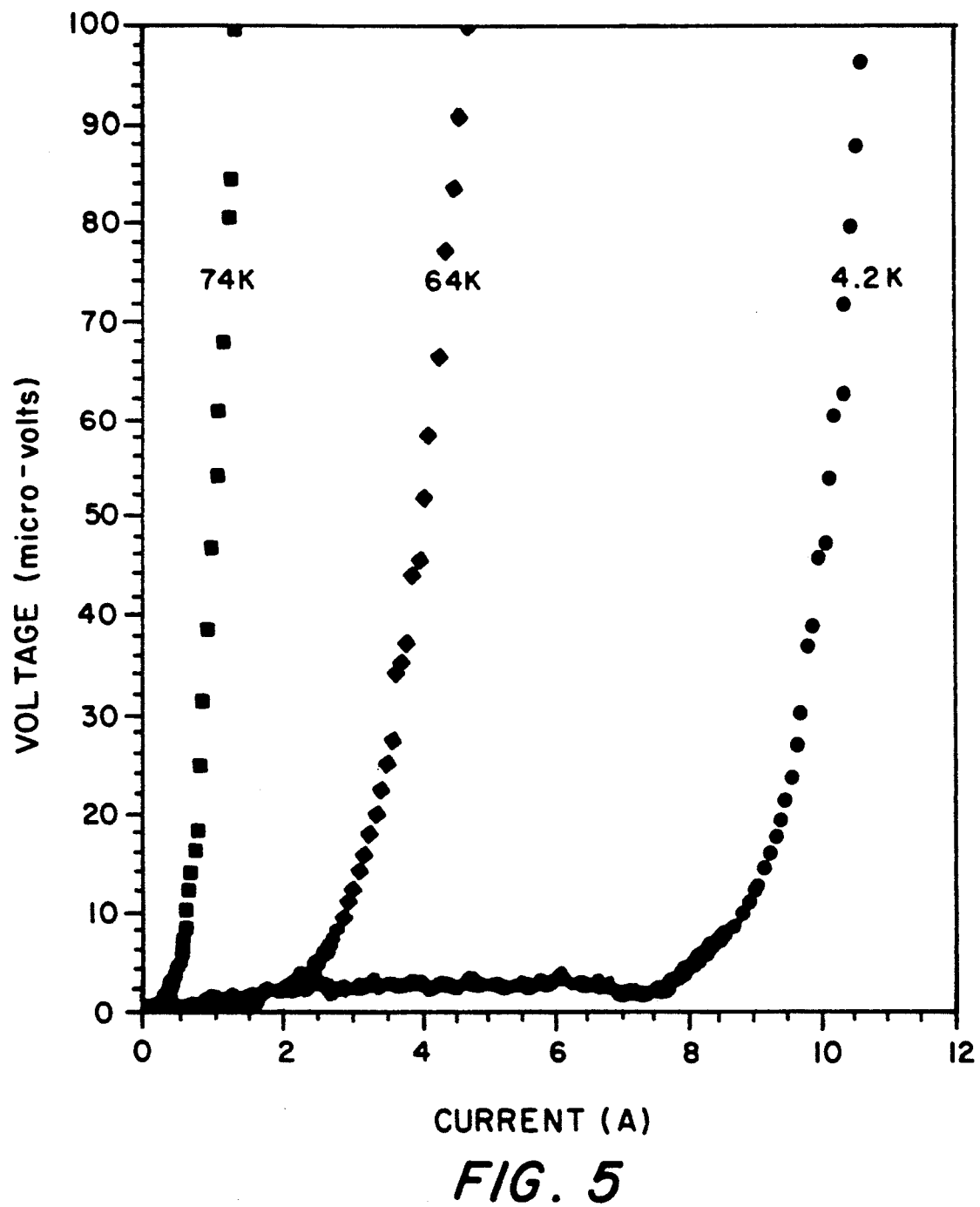
FIG. 5 is a plot of typical data collected for a $J_c$ measurement on a surface ground and reannealed film produced according to the present invention. Sample dimensions for the film are t=0.1 mm, w=1.3 mm, and l=3.4 mm, where t is thickness, w is width, and l is length.

The fired 2212 coatings were superconducting. FIG. 4 shows a typical resistance-temperature curve with R=0 at 75K. In general, the T was near 80K for the 2212 material, with more homogenous films having higher T=0 temperatures. The critical current of the fired films was also a function of microstructure, as already discussed. Samples which had not been homogenized by reannealing had relatively low critical currents ($J_c\approx$100 A/cm²) at 64K and lower R=0 temperatures (72-75K). The sample which was polished to remove the cuprate needles and then reannealed had much higher critical current densities, $J_c$>1700 A/cm² at 64K and $J_c$>6000 A/cm² at 4.2K (see FIG. 5) and a higher R=0 temperature (80K).

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

We claim:

1. A process of forming an oriented thick film superconducting coating on a polycrystalline substrate selected from the group consisting of MgO, alumina, mullite, SrTiO₃, ZrO₂, ZrTiO₄, BaTiO₃ and mixtures thereof, the coating comprising at least two highly oriented platelet components of $Bi_aSr_bCa_cCu_dO_x$ (BSCCO)

wherein in one component, a is 2, b is 2, c is 1, d is 2, and x=8 and, in another component, a is 2, b is 2, c is 0, d is 1, and x is $\approx$6, oriented such that said BSCCO platelets are essentially parallel to said substrate, the process comprising the steps of:

applying a powder mixture prepared from Bi₂O₃, SrCO₃, CaCO₃, and CuO onto a polycrystalline substrate, in amount sufficient to provide upon melting, a coating of about 75 μm to about 250 μm thickness upon said substrate;

rapidly heating the resultant coated substrate to a temperature ranging from about 1000°-1100° C. for a period of from about 5-30 minutes to completely melt said powder mixture and thus form a molten, thick film coating of about 75 μm to about 250 μm thickness;

rapidly quenching the coated substrate at a rate of at least 50° C./minute to a temperature below about 500° C., which is below that temperature at which phase transition occurs; and annealing the resultant coated substrate, by heating in an atmosphere of an oxygen-containing gas to a temperature of from about 850°-870° C.

2. The process of claim 1, wherein the polycrystalline substrate is MgO.

3. The process of claim 1, wherein the polycrystalline substrate is alumina.

4. The process of claim 1, wherein the polycrystalline substrate is mullite, or strontium titanate.

5. The process of claim 1, wherein the coating also contains Bi₂Sr₂Ca₂Cu₃O₁₀.

6. The process of claim 1, wherein the powder in the powder mixture is no larger than 150 μm.

7. The process of claim 1, wherein prior to application to a polycrystalline substrate, the powder mixture is calcined at a temperature of from about 840°–860° C. to remove carbonate, hydroxides, and water.

8. The process of claim 1, wherein the powder-coated polycrystalline substrate is heated to a temperature of from about 1050°–1100° C. for period of from about 15–30 minutes.

9. The process of claim 1, wherein the rapid quenching is conducted in air at an average temperature decrease of at least 100 Centigrade degrees per minute to about room temperature.

10. The process of claim 1, wherein the oxygen-containing gas is air.

11. The process of claim 1, wherein the oxygen-containing gas is oxygen.

12. The process of claim 1, wherein the annealing is carried out for a period of from about 1–2 hours.

13. The process of claim 1, wherein the resultant annealed coated substrate is lightly polished to remove at least some $Ca_2CuO_3$ formed on the surface of the thick film -coating.

14. The process of claim 13 wherein the polished coated substrate is reannealed by heating to a temperature of from about 840°–870° C. for a period of from about 1–2 hours.

15. The process of claim 1, wherein the powder mixture is prepared from $Bi_2O_3$, $SrCO_3$, $CaCO_3$, and $CuO$ in the stoichiometric ratios of 4,3,3,6 or 4,3,3,4 or 2,2,2,3 or 2,2,3,4, respectively.

16. The process of claim 1, wherein the oxygen-containing gas comprises of from about 10–15 vol. % oxygen.

17. The process of claim 1, wherein the stoichiometric ratio of $BiO_3$, $SrCO_3$, $CaCO_3$, and $CuO$ in said powder mixture is 2:2:3:4, respectively.

18. The process of claim 1, wherein in the coating powder, lead is used in place of part of the Bi, and the annealing is carried out at a temperature no higher than about 850° C.

* * * * *